(12) United States Patent
Choi et al.

(10) Patent No.: US 11,404,764 B2
(45) Date of Patent: Aug. 2, 2022

(54) ELECTRONIC DEVICE INCLUDING PLURALITY OF ANTENNAS

(71) Applicant: SAMSUNG ELECTRONICS CO., LTD., Suwon-si (KR)

(72) Inventors: Jongwook Choi, Suwon-si (KR); Hyojin Jang, Suwon-si (KR); Kyungrok Lee, Suwon-si (KR); Handug Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 6 days.

(21) Appl. No.: 17/168,619

(22) Filed: Feb. 5, 2021

(65) Prior Publication Data

US 2021/0249761 A1 Aug. 12, 2021

(30) Foreign Application Priority Data

Feb. 10, 2020 (KR) ........................ 10-2020-0015955

(51) Int. Cl.
*H01Q 1/24* (2006.01)
*H01Q 1/00* (2006.01)
(Continued)

(52) U.S. Cl.
CPC ........... *H01Q 1/243* (2013.01); *H01Q 1/2283* (2013.01); *H01Q 1/38* (2013.01); *H01Q 1/526* (2013.01)

(58) Field of Classification Search
CPC ........ H01Q 1/24; H01Q 1/243; H01Q 1/2283; H01Q 1/2291; H01Q 1/38; H01Q 1/526;
(Continued)

(56) References Cited

U.S. PATENT DOCUMENTS 9,450,665 B2 9/2016 Sampson et al.
10,727,568 B2 7/2020 Cho et al.
(Continued)

FOREIGN PATENT DOCUMENTS

CN 106876875 6/2017
CN 108617075 10/2018
(Continued)

OTHER PUBLICATIONS

International Search Report and Written Opinion dated May 28, 2021 in corresponding International Application No. PCT/KR2020/001413.

*Primary Examiner* — Thai Pham
(74) *Attorney, Agent, or Firm* — Nixon & Vanderhye, P.C.

(57) ABSTRACT

An electronic device is disclosed. An electronic device according to an embodiment may include: a first Printed Circuit Board (PCB), a second PCB, a Radio Frequency (RF) transceiver disposed on the first PCB, a Flexible Printed Circuit Board (FPCB) coupled with the first PCB and the second PCB and electrically coupled with the RF transceiver, the FPCB including a transmission line of a wireless communication signal, an amplifier disposed on the second PCB and electrically coupled with the RF transceiver by the FPCB, a first antenna electrically coupled with the amplifier through the second PCB and configured to receive a wireless communication signal corresponding to a first frequency, and a second antenna electrically coupled with the amplifier through the second PCB and configured to receive a wireless communication signal corresponding to a second frequency. The first antenna and the second antenna may be disposed closer to the second PCB than the first PCB in the electronic device. The amplifier may amplify a (Continued)

wireless communication signal received from the first antenna and second antenna.

20 Claims, 7 Drawing Sheets

(51) Int. Cl.
*H01Q 1/22* (2006.01)
*H01Q 1/38* (2006.01)
*H01Q 1/52* (2006.01)

(58) Field of Classification Search
CPC ........ H01Q 1/00; H01Q 1/002; H04B 1/0458; H04B 1/18
See application file for complete search history.

(56) References Cited

U.S. PATENT DOCUMENTS

| | | | |
|---|---|---|---|
| 2017/0358847 A1* | 12/2017 | Cho | H05K 1/18 |
| 2018/0277929 A1* | 9/2018 | Seo | H01Q 1/525 |
| 2018/0277934 A1* | 9/2018 | Kim | H04M 1/026 |
| 2019/0384358 A1 | 12/2019 | Choe et al. | |
| 2020/0161763 A1* | 5/2020 | Lee | H01Q 21/28 |

FOREIGN PATENT DOCUMENTS

| | | |
|---|---|---|
| KR | 10-1001114 | 12/2010 |
| KR | 10-2017-0140691 | 12/2017 |
| KR | 10-2019-0141474 | 12/2019 |

\* cited by examiner

ELECTRONIC DEVICE INCLUDING PLURALITY OF ANTENNAS

CROSS-REFERENCE TO RELATED APPLICATION

This application is based on and claims priority under 35 U.S.C. § 119 to Korean Patent Application No. 10-2020-0015955, filed on Feb. 10, 2020, in the Korean Intellectual Property Office, the disclosure of which is incorporated by reference herein in its entirety.

BACKGROUND

Field

The disclosure relates to an electronic device including a plurality of antennas.

Description of Related Art

With the advancement of communication technologies, various services using the communication technologies have been produced. Some services require data communication of a very high throughput. Accordingly, technologies for transmitting large-capacity data in various environments have been actively researched and developed. Among them, a Multiple Input Multiple Output (MIMO) communication system may include a plurality of Transmit (Tx) antennas of a transmitting device (e.g., a base station) and a plurality of Receive (Rx) antennas of a receiving device (e.g., a user terminal) to transmit a plurality of streams simultaneously using the plurality of antennas, thereby improving a throughput.

Meanwhile, the user terminal may have at least two antennas and a Printed Circuit Board (PCB) at each of upper and lower ends of the terminal. A Radio Frequency (RF) transceiver for processing a wireless communication signal received from the plurality of antennas may be mounted on a first PCB at the upper end of the terminal, and a wireless communication signal received from antennas at the lower end of the terminal may be provided to the RF transceiver through a Flexible Printed Circuit Board (FPCB) which couples the first PCB and a second PCB at the lower end of the terminal.

Since the RF transceiver is relatively far in distance to the antennas at the lower end of the terminal and the wireless communication signal is transmitted through the FPCB, there may be an increase in a transmission line loss of the wireless communication signal received from the antennas disposed to the lower end of the terminal. Since the RF transceiver is relatively close in distance to the antennas at the upper end of the terminal, performance of the antennas at the lower end of the terminal may deteriorate, compared to the antennas at the upper end of the terminal.

All of the plurality of antennas included in the terminal may operate in a MIMO communication system of a 5G SUS 6 (a frequency band below 6 GHz). In this case, a performance deviation between the antennas may degrade communication performance of the user terminal.

SUMMARY

Embodiments of the disclosure provide an electronic device that can decrease a signal loss which may occur in a process of transferring a signal to a Radio Frequency (RF) transceiver.

Embodiments of the disclosure provide an electronic device that can improve reception sensitivity of an antenna.

Embodiments of the disclosure provide an electronic device that can decrease a performance deviation between antennas, and can improve Multiple Input Multiple Output (MIMO) communication performance.

An electronic device according to an example embodiment may include: a first Printed Circuit Board (PCB), a second PCB, a Radio Frequency (RF) transceiver disposed on the first PCB, a Flexible Printed Circuit Board (FPCB) coupled with the first PCB and the second PCB and electrically coupled with the RF transceiver, the FPCB including a transmission line of a wireless communication signal, an amplifier disposed on the second PCB and electrically coupled with the RF transceiver via the FPCB, a first antenna electrically coupled with the amplifier through the second PCB and configured to receive a wireless communication signal corresponding to a first frequency, and a second antenna electrically coupled with the amplifier through the second PCB and configured to receive a wireless communication signal corresponding to a second frequency. The first antenna and the second antenna may be disposed closer to the second PCB than the first PCB in the electronic device. The amplifier may amplify a wireless communication signal received from the first antenna and second antenna.

An electronic device according to an example embodiment may include: a housing, a first PCB disposed in the housing, a second PCB spaced apart from the first PCB and disposed in the housing, an RF transceiver circuit disposed on the first PCB, a Flexible printed circuit Radio frequency Cable (FRC) coupled with the first PCB and the second PCB, an amplifier disposed on a first face of the second PCB and electrically coupled with the RF transceiver circuit via the FRC, a first antenna disposed on the first face of the second PCB and electrically coupled with the amplifier, and a second antenna disposed on the first face of the second PCB and electrically coupled with the amplifier. The first antenna and the second antenna may be configured to operate as an antenna for MIMO communication. The RF transceiver circuit may be configured to amplify an RF signal received through the first antenna and the second antenna, using the amplifier, and receive the amplified signal output from the amplifier through the FRC.

An electronic device according to various embodiments can decrease a signal loss which may occur in a process of transferring a signal to a Radio Frequency (RF) transceiver.

An electronic device according to various embodiments can improve reception sensitivity of an antenna.

An electronic device according to various embodiments can decrease a performance deviation between antennas, and can improve Multiple Input Multiple Output (MIMO) communication performance.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
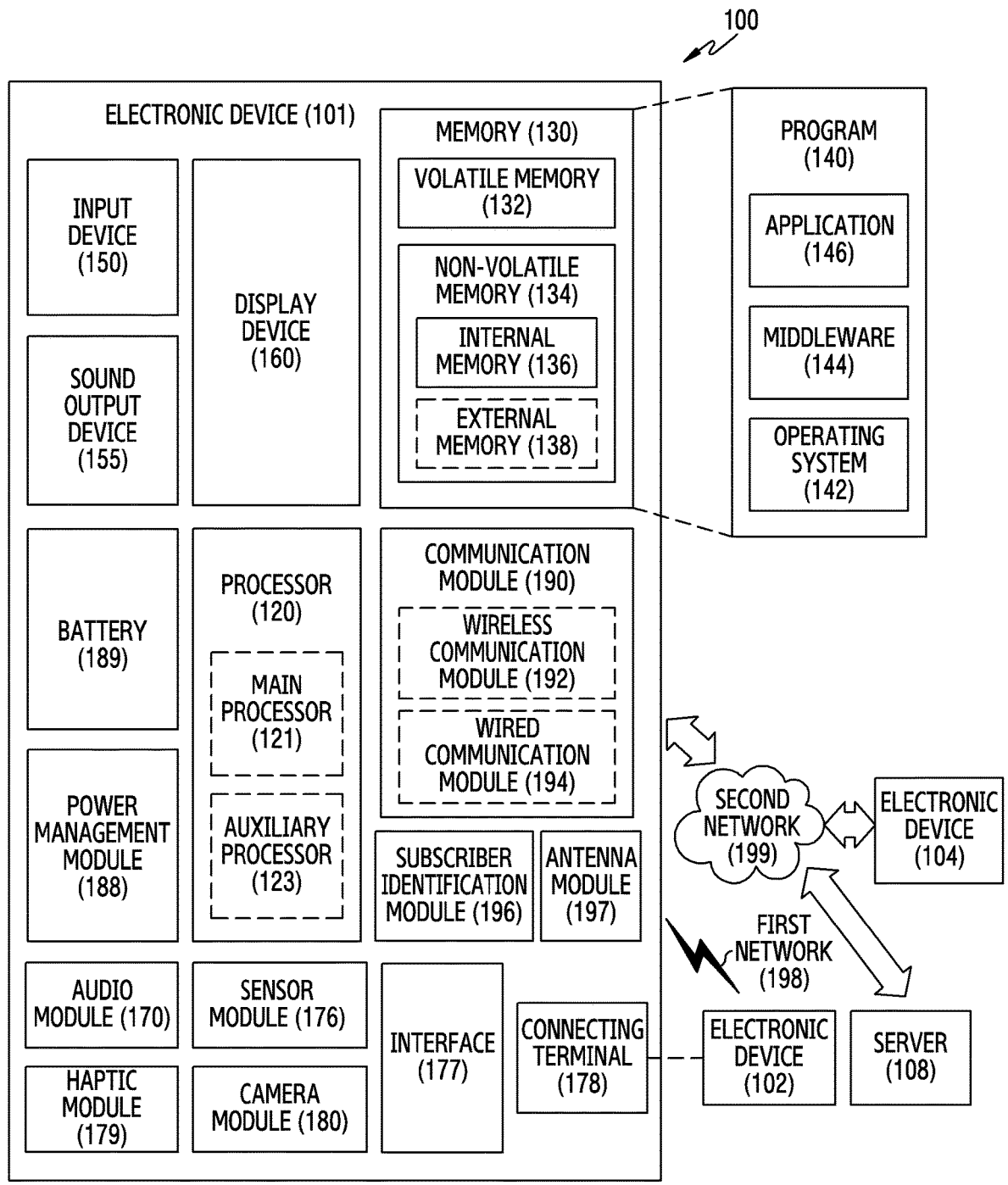
FIG. 1 is a block diagram illustrating an example electronic device in a network environment, according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally, or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively, or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
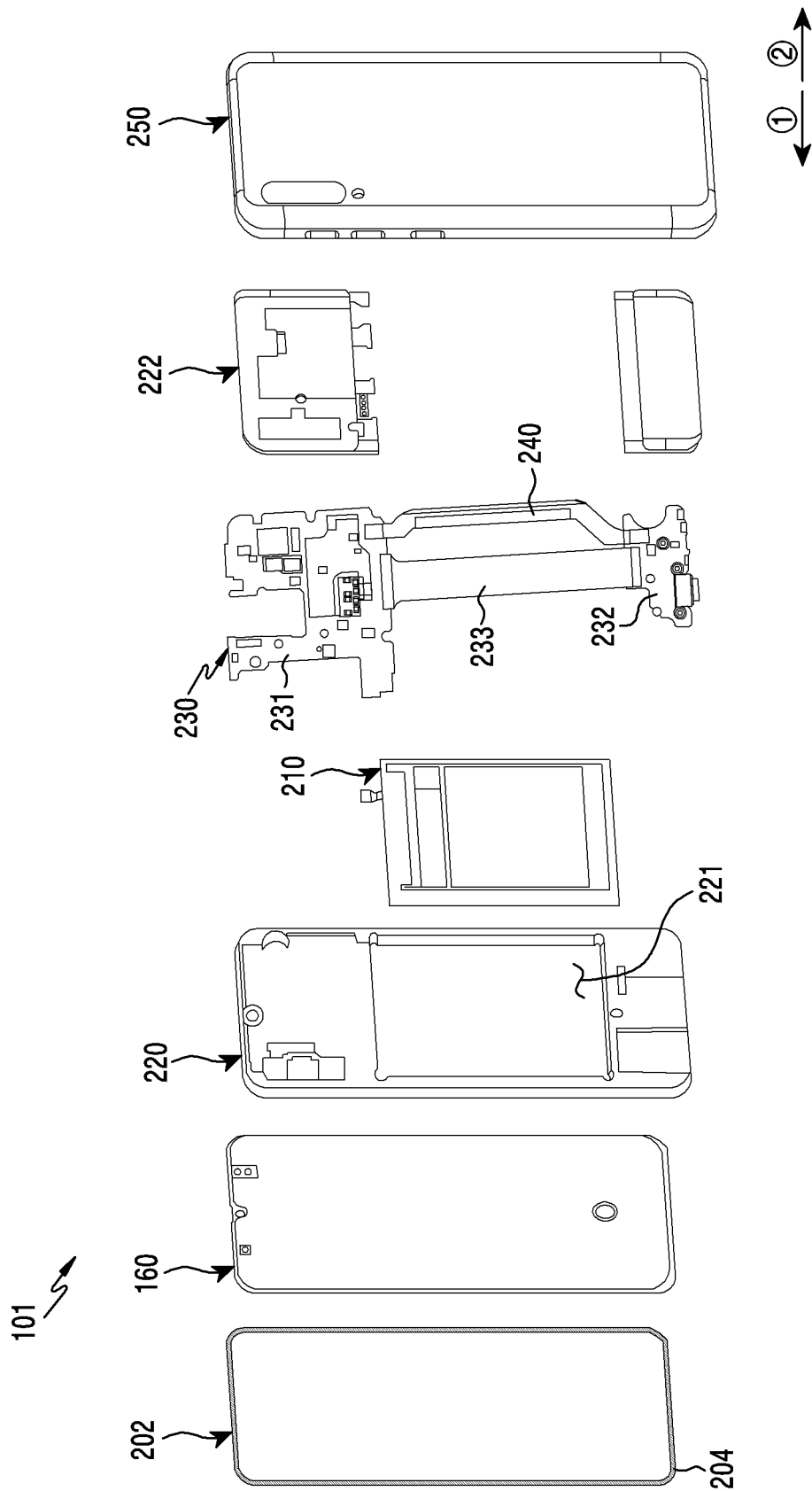
FIG. 2 is an exploded perspective view illustrating an example electronic device according to various embodiments.

FIG. 2 is an exploded perspective view illustrating an example of the electronic device 101 according to various embodiments.

Referring to FIG. 2, the electronic device 101 may include a window 202, the display 160, a first bracket 220, a battery 210, a Printed Circuit Board (PCB) 230, a second bracket 222, and a housing 250.

In an embodiment, the window 202 may be disposed above the display 160 (e.g., in a direction ①). The window 202 may further include a light-shielding film 204 for covering a portion of the first bracket 220 and a non-display area of the display 160 which is visible through the substantially transparent window 202.

In an embodiment, the display 160 may be disposed between the window 202 and the first bracket 220. The display 160 may be electrically coupled with the PCB 230 by (e.g., via) a Flexible Printed Circuit Board (FPCB) (not shown).

In an embodiment, the first bracket 220 may be disposed between the display 160 and the PCB 230. The first bracket 220 may support components of the electronic device 101, or may provide a space capable of accommodating the component of the electronic device 101. For example, the first bracket 220 may be disposed below the display 160 (e.g., in a direction ②) to support the display 160. For another example, the first bracket 220 may provide a mounting space 221 capable of accommodating the battery 210.

In an embodiment, at least part of the first bracket 220 may be constructed as an antenna radiator for transmitting/receiving a wireless communication signal. The at least part of the first bracket 220 which is utilized as the antenna radiator may include metal. In the first bracket 220, at least part of an area which is utilized as the antenna radiator may be exposed to the outside.

In an embodiment, the battery 210 may be disposed such that at least part thereof is accommodated in the mounting space 221. The battery 210 may store power required in the electronic device 101. The battery 210 may include, for example, a non-rechargeable primary cell, a rechargeable secondary cell, or a fuel cell. The battery 210 may be disposed integrally inside the electronic device 101, or may be detachably disposed with respect to the electronic device 101.

In an embodiment, the PCB 230 may be disposed between the first bracket 220 and the second bracket 222. A first PCB 231 and a second PCB 232 may be supported by the first bracket 220 and/or the second bracket 222.

In an embodiment, the PCB 230 may include the first PCB 231 (e.g., a main PCB), the second PCB 232 (e.g., a sub PCB), a first FPCB 233, and a second FPCB 240.

In an embodiment, a processor, a memory, and an interface may be mounted on the first PCB 231 or the second PCB 232. The processor may include various processing circuitry including, for example, and without limitation, one or more of a central processing unit, a dedicated processor, an application processor, a graphic processing unit, an image signal processor, a sensor hub processor, a communication processor, or the like. The memory may include, for example, a volatile memory or a non-volatile memory. The interface may include, for example, a High-Definition Multimedia Interface (HDMI), a Universal Serial Bus (USB) interface, a Secure Digital (SD) card interface, and/or an audio interface. For example, the interface may electrically or physically couple the electronic device 101 and an external electronic device, and may include a USB connector, an SD card/MMC connector, or an audio connector.

In an embodiment, the first PCB 231 and the second PCB 232 may provide an electrical connection path between various components of the electronic device 101. For example, each of the camera module 112, the battery 210, the display 160, and the processor may be electrically coupled, directly or indirectly, with the first PCB 231 or the second PCB 232, and may be operatively coupled with the camera module 112, the battery 210, and the display 160 through the electrical connection path provided by the first PCB 231 and the second PCB 232.

In an embodiment, the first PCB 231 and the second PCB 232 may be electrically coupled by the first FPCB 233. The first FPCB 233 may be implemented at least in part in the form of an FPCB constructed of a flexible material.

In an embodiment, the second FPCB 240 may be coupled with the first PCB 231 and the second PCB 232. The second FPCB 240 may include a plurality of transmission lines for transmitting/receiving a wireless communication signal. The second FPCB 240 may be referred to as an FPCB Radio frequency Cable (FRC) 240 in a sense that it includes the transmission line for transmitting/receiving the wireless communication signal.

In an embodiment, the second bracket 222 may be disposed between the first PCB 231 and the housing 250. The second bracket 222 may be accommodated in a space constructed by the housing 250. The second bracket 222 may include metal and/or non-metal (e.g., polymer).

In an embodiment, the housing 250 may be disposed below the second bracket 222 (e.g., in the direction ②). In an embodiment, the housing 250 may be physically coupled with the first bracket 220 and/or the second bracket 222. For example, the housing 250 may be coupled with the first bracket 220 and/or the second bracket 222 by at least one coupling member (e.g., a screw) (not shown). For another example, the housing 250 may be coupled with the first bracket 220 and/or the second bracket 222 by an adhesive member (e.g., an adhesive tape or an adhesive solution) (not shown). For another example, at least two of the housing 250, the first bracket 220, and/or the second bracket 222 may be integrally constructed.

Figure 3:
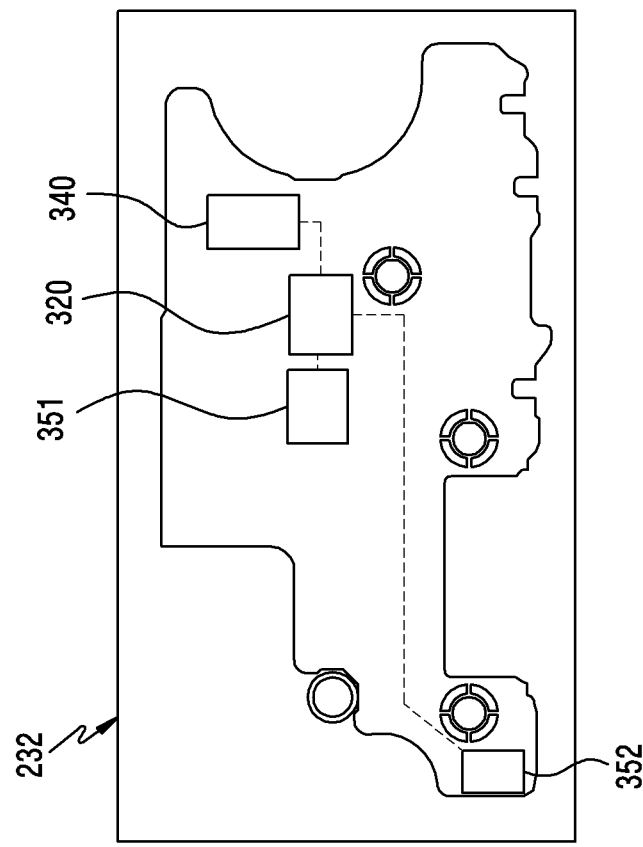
FIG. 3 is a diagram illustrating an example Printed Circuit Board (PCB) of an electronic device according to various embodiments.
Figure 3:
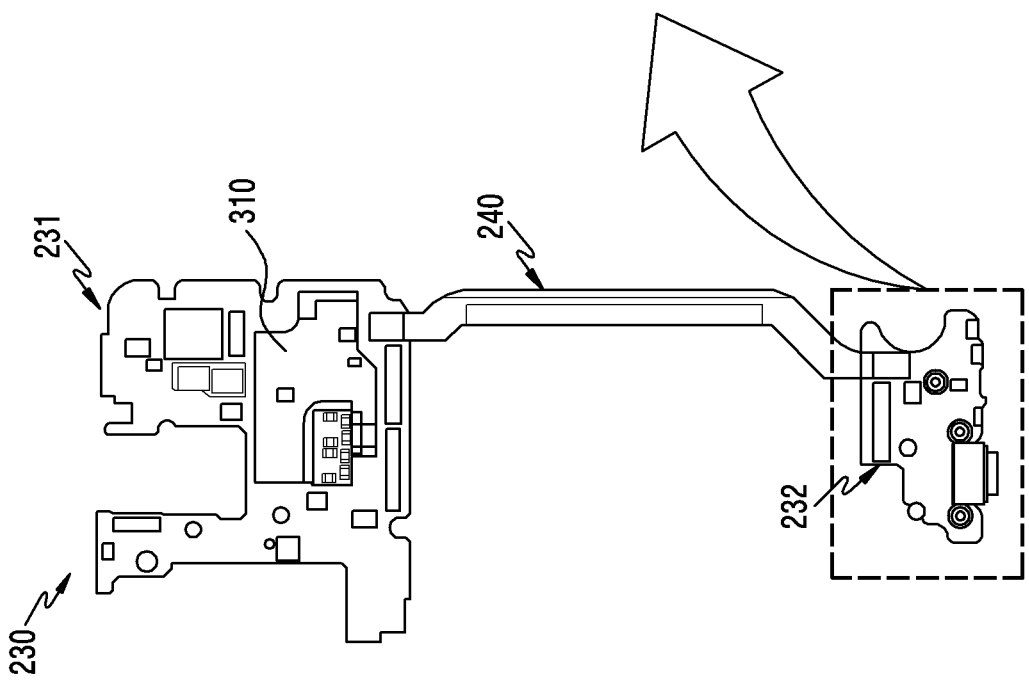

FIG. 3 is a diagram illustrating the PCB 230 of the electronic device 101 according to various embodiments.

Referring to FIG. 3, the electronic device 101 according to an embodiment may include an RF transceiver 310, a Low noise amplifier Front End Module (LFEM) 320, a first antenna contact portion 351, and a second antenna contact portion 352.

In an embodiment, a first antenna of the electronic device 101 may be electrically coupled to the first antenna contact portion 351 of the second PCB 232.

In an embodiment, a second antenna of the electronic device 101 may be electrically coupled to the second antenna contact portion 352 of the second PCB 232.

In an embodiment, various types of antennas may be applied for the first antenna and/or the second antenna.

For example, the first antenna and/or the second antenna may include a Laser Direct Structuring (LDS) antenna (or a pattern antenna) constructed on the second PCB 232 or another component of the electronic device 101. When the first antenna and/or the second antenna are constructed as the LDS antenna, locations at which the first antenna and/or the second antennas are constructed may, or may not, correspond to (or overlap with) the first PCB 231 and/or the second PCB 232. In this case, however, the first antenna and the second antenna may also be closer to the second PCB 232 than the first PCB 231.

For another example, the first antenna and/or the second antenna may be implemented such that a metal housing (e.g., the first bracket 220 of FIG. 2) of an exterior of the electronic device 101 is divided into a non-conductive member, and part of the divided metal housing operates as an antenna radiator. In an embodiment, the first antenna and/or the second antenna may be disposed or constructed on the second PCB 232 according to a type thereof, or may be disposed or constructed at a periphery portion of the second PCB 232. In this case, however, the first antenna and the second antenna may also be closer to the second PCB 232 than the first PCB 231.

In an embodiment, the first antenna contact portion 351 may be referred to as the first antenna 351 in a sense that the first antenna is electrically coupled, and the second antenna contact portion 352 may be referred to as the second antenna 352 in a sense that the second antenna is electrically coupled. Hereinafter, for convenience of explanation, the first antenna and the first antenna contact portion 351 are collectively referred to as the first antenna 351, and the second antenna and the second antenna contact portion 352 are collectively referred to as the second antenna 352.

In an embodiment, the RF transceiver 310 may be disposed on the first PCB 231. The RF transceiver 310 may receive an RF signal received from the first antenna contact portion 351 and/or the second antenna contact portion 352. The RF transceiver 310 may down-convert the received RF signal to generate an Intermediate Frequency (IF) or baseband signal. The RF transceiver 310 may perform filtering, decoding, and/or digitalizing on the IF or baseband signal. The RF transceiver 310 may provide the processor 120 with the baseband signal subjected to the filtering, decoding, and/or digitalizing process. The aforementioned structure and operation of the RF transceiver 310 may be changed variously within an applicable range by those ordinarily skilled in the art. For example, the RF transceiver 310 may include at least part of the structure of the communication module 190 or wireless communication module 192 of FIG. 1.

In an embodiment, the FRC 240 may be coupled to the first PCB 231 and the second PCB 232. For example, the FRC 240 may include a first connection constructed at one end of the FRC 240 and a second connector constructed at the other end of the FRC 240. The first connector may be coupled to the first PCB 231, and the second connector may be coupled to a connector 340 of the second PCB 232.

In an embodiment, the LFEM 320 may be disposed on the second PCB 231, and may be electrically coupled with the RF transceiver 310 by the FRC 240. The LFEM 320 may be disposed between the connector 340 and the first antenna 351, on the second PCB 232. The LFEM 320 may be disposed between the connector 340 and the second antenna 352, on the second PCB 232.

In an embodiment, the LFEM 320 may include at least one Low Noise Amplifier (LNA) and at least one filter for selecting a frequency band. A weak signal received from the first antenna 351 and the second antenna 352 may be amplified to a level required by the LFEM 320. Since a distance from the first antenna 351 and the second antenna 352 to the RF transceiver 310 is relatively long in the electronic device 101, a signal loss may be increased in a process in which a wireless communication signal received from the first antenna 351 and the second antenna 352 is provided to the RF transceiver 310 through the FRC 240. The electronic device 101 according to an embodiment may reduce noise and increase a gain of the wireless communication signal received from the first antenna 351 and the second antenna 352 using the LFEM 320, and may compensate for the loss which occurs in the process of transferring the signal to the RF transceiver 310. Reception sensitivity per frequency band and a difference thereof are shown in Table 1 and Table 2 below, for a case where the LFEM 320 is included and a case where the LFEM 320 is not included.

In an embodiment, the first antenna 351 and the second antenna 352 may be electrically coupled with the LFEM 320 through an electrical wiring provided by the second PCB 232.

Although not shown in FIG. 3, the electronic device 101 according to an embodiment may include a plurality of antennas which are distinct from the first antenna 351 and the second antenna 352. The plurality of antennas may be disposed closer to the first PCB 231 than the second PCB 232. Since a length of a transmission line connected from the first antenna 351 and the second antenna 352 to the RF transceiver 310 is longer than a length of a transmission line connected from the plurality of antennas to the RF transceiver 310, performance of the first antenna 351 and second antenna 352 may be lower than the plurality of antennas due to a transmission line loss. In an embodiment, the first antenna 351 and the second antenna 352 may be implemented as an antenna for MIMO communication together with the plurality of antennas, and the electronic device 101 may include a configuration required for MIMO communication. In an embodiment, a signal received from the first antenna 351 and the second antenna 352 is amplified using

TABLE 1

| BAND | B2 | | | | B4 | | B25 | | |
|---|---|---|---|---|---|---|---|---|---|
| CHANNEL FREQUENCY [MHz] | 650 1935 | 900 1960 | 1150 1985 | 2000 2115 | 2175 2132.5 | 2350 2150 | 8090 1935 | 8365 1962.5 | 8640 1990 |
| LFEM not included [dBm] | −96.7 | −97.6 | −97.3 | −97.9 | −98.1 | −97.8 | −97.0 | −97.3 | −97.6 |
| LFEM included [dBm] | −99.2 | −99.9 | −100.0 | −100.0 | −100.6 | −100.1 | −99.1 | −99.9 | −100 |
| difference | 2.5 | 2.3 | 2.7 | 2.1 | 2.5 | 2.3 | 2.1 | 2.6 | 2.4 |

TABLE 2

| BAND | B7 | | | B66 | | | B30 |
|---|---|---|---|---|---|---|---|
| CHANNEL FREQUENCY [MHz] | 2800 2625 | 3100 2655 | 3400 2685 | 66486 2110 | 66786 2155 | 67806 2200 | 9820 2355 |
| LFEM not included [dBm] | −97.5 | −98.4 | −98.2 | −97.7 | −97.9 | −98.3 | −97.7 |
| LFEM included [dBm] | −100.2 | −100.9 | −100.8 | −99.9 | −100.4 | −100.6 | −100.5 |
| difference | 2.7 | 2.5 | 2.6 | 2.2 | 2.5 | 2.3 | 2.8 |

The electronic device 101 may amplify and transmit a signal to compensate for a loss which may occur in a process of transferring a signal received from an antenna to the RF transceiver 310.

Even if the electronic devices 101 are manufactured through the same manufacturing process, each of the electronic devices 101 may have a variation in reception performance of a wireless communication signal. The electronic device 101 according to an embodiment may amplify the received signal to an appropriate level in the LFEM 320, thereby reducing a deviation in the reception sensitivity of each of the electronic devices 101. Taking twenty electronic devices 101 as a sample, a standard deviation of measured reception sensitivity is shown in Table 3 below, for a case where the LFEM 320 is included and a case where the LFEM 320 is not included.

TABLE 3

| BAND | B2 | B4 | B25 | B7 | B66 | B30 |
|---|---|---|---|---|---|---|
| LFEM not included | 1.9 | 1.5 | 2.1 | 2.5 | 1.7 | 2.4 |
| LFEM included | 0.9 | 0.8 | 1.0 | 1.1 | 0.8 | 1.2 | the LFEM 320, thereby reducing a performance deviation between the first and second antennas 351 and 352 and the plurality of antennas and improving MIMO communication performance of the electronic device 101.

Figure 4:
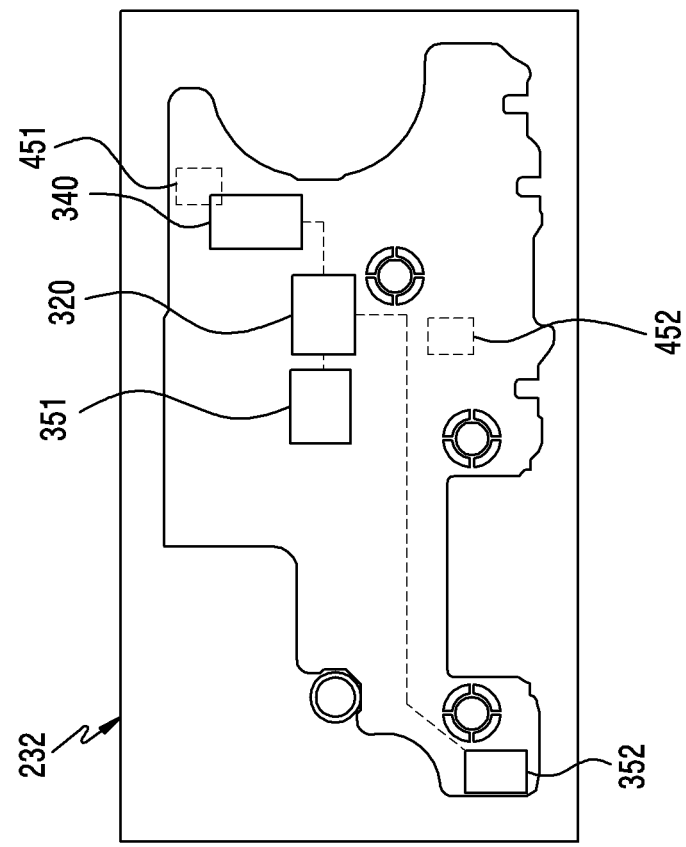
FIG. 4 is a diagram illustrating an example PCB of an electronic device according to various embodiments.
Figure 4:
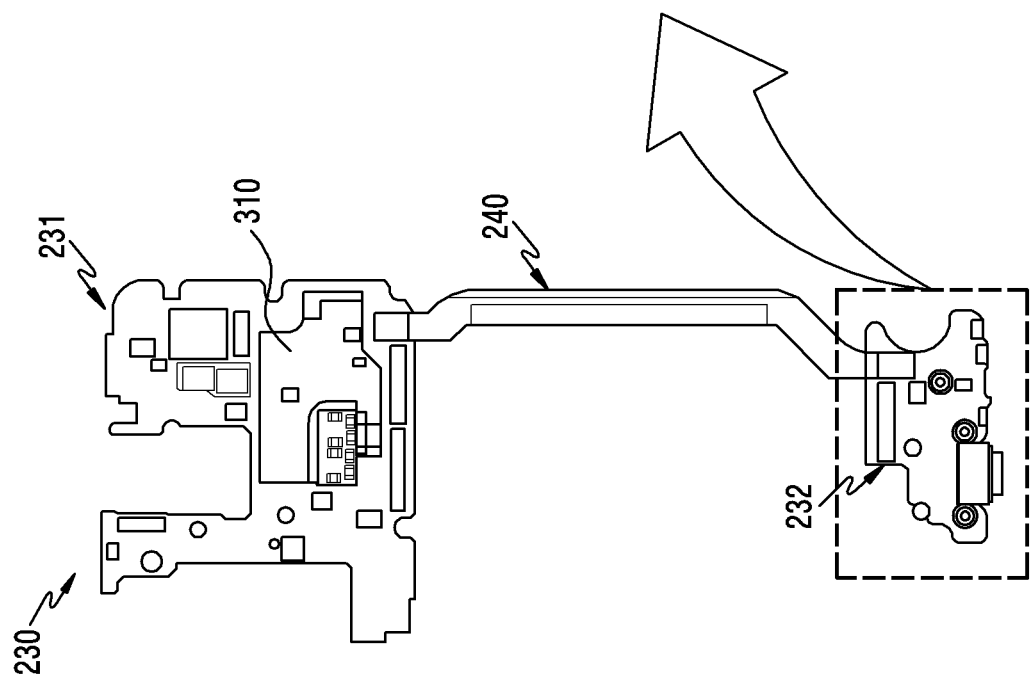

FIG. 4 is a diagram illustrating an example of the PCB 230 of the electronic device 101 according to various embodiments.

Figure 5:
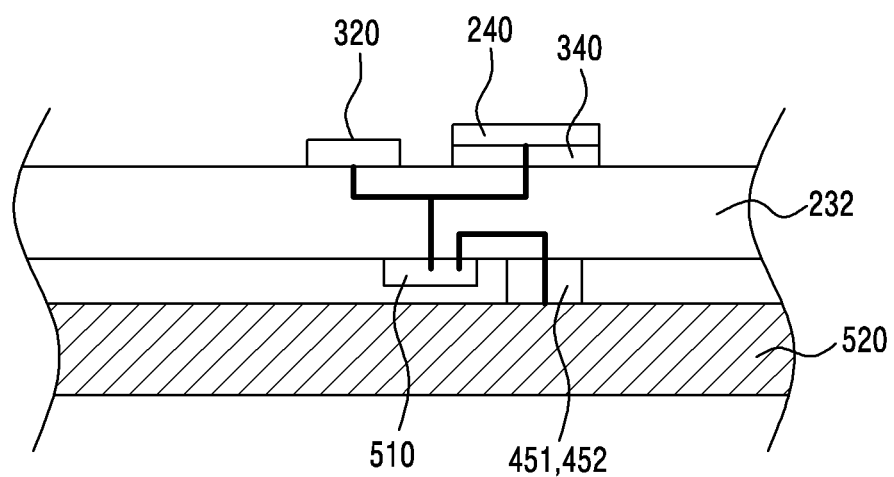
FIG. 5 is a sectional view illustrating an example connection relationship of a Low noise amplifier Front End Module (LFEM), a Flexible printed circuit Radio frequency Cable (FRC), and a first conductive member, according to various embodiments.

FIG. 5 is a sectional view illustrating an example connection relationship of the LFEM 320, the FRC 240, and the first conductive member 451, according to various embodiments.

In FIG. 4 and FIG. 5, descriptions on a structure having the same reference numeral as the structure of FIG. 1, FIG. 2 and FIG. 3 may be applied in the same manner as in the descriptions of FIG. 1, FIG. 2 and FIG. 3.

Referring to FIG. 4, the electronic device 101 according to an embodiment may include a first conductive member 451 and a second conductive member 452 including a conductive material.

In an embodiment, the first conductive member 451 may be disposed to the second PCB 232. For example, the first conductive member 451 may be disposed on a face opposite to a face on which the connector 340 of the second PCB 232 to be coupled with the FRC 240 is disposed. The first conductive member 451 may be disposed to be closer to the connector 340 than the LFEM 320, on the second PCB 232. The first conductive member 451 may overlap at least in part with the connector 340.

In an embodiment, the second conductive member 452 may be disposed to the second PCB 232. For example, the second conductive member 452 may be disposed on a face opposite to a face on which the LFEM 320 of the second PCB 232 is disposed. The second conductive member 452 may be disposed to be closer to the connector 340 than the LFEM 320, on the second PCB 232. Referring to FIG. 5, the first conductive member 451 may be electrically coupled with the connector 340 and the LFEM 320. When the FRC 240 is coupled to the connector 340, the first conductive member 451 may be electrically coupled with the FRC 240 through the connector 340. In an embodiment, the first conductive member 451 may be in contact with a metal housing 520 (e.g., the housing 250, first bracket 220, or second bracket 222 of FIG. 2) of the electronic device 101.

In an embodiment, an electrical path may be connected from the LFEM 320 and the connector 340 to the housing 520 via a ground plane of the second PCB 232. In an embodiment, a protection element 510 may be disposed to the second PCB 232. In an embodiment, the protection element 510 may be disposed between the LFEM 320 and the connector 340 and an electrical connection path of the first conductive member 451. The protection element 510 may include a varistor, a zener diode, or a capacitor. The protection element 510 may block a voltage higher than a threshold to prevent and/or reduce an electric shock accident caused by the housing 520 of the electronic device 101.

In an embodiment, since the housing 520 of the electronic device 101 functions as a ground of the LFEM 320 and FRC 240, when a wireless communication signal is transmitted through the FRC 240 and the operation of the LFEM 320, it is possible to prevent and/or reduce noise which may be introduced from surroundings. In an embodiment, antenna reception sensitivity of the electronic device 101 including the first conductive member 451 and the second conductive member 452 may be improved.

Although it has been described based on the first conductive member 451 with reference to FIG. 4 and FIG. 5, it is also equally applied to the second conductive member 452. For example, the second conductive member 452 may be electrically coupled with the LFEM 320 and the connector 340 in the same or corresponding manner as the first conductive member 451.

In an embodiment, a ground of the FRC 240 may be electrically coupled with a ground of the second PCB 232 through the connector 340, and the ground of the second PCB 232 may be coupled to the housing 520 (e.g., the housing 250, first bracket 220, or second bracket 222 of FIG. 2) using the first conductive member 451 and the second conductive member 452. Since the first conductive member 451 and second conductive member 452 disposed near the LFEM 320 and the connector 340 are used to reinforce the ground, influence of ambient noise can be decreased when a signal is transmitted.

Figure 6:
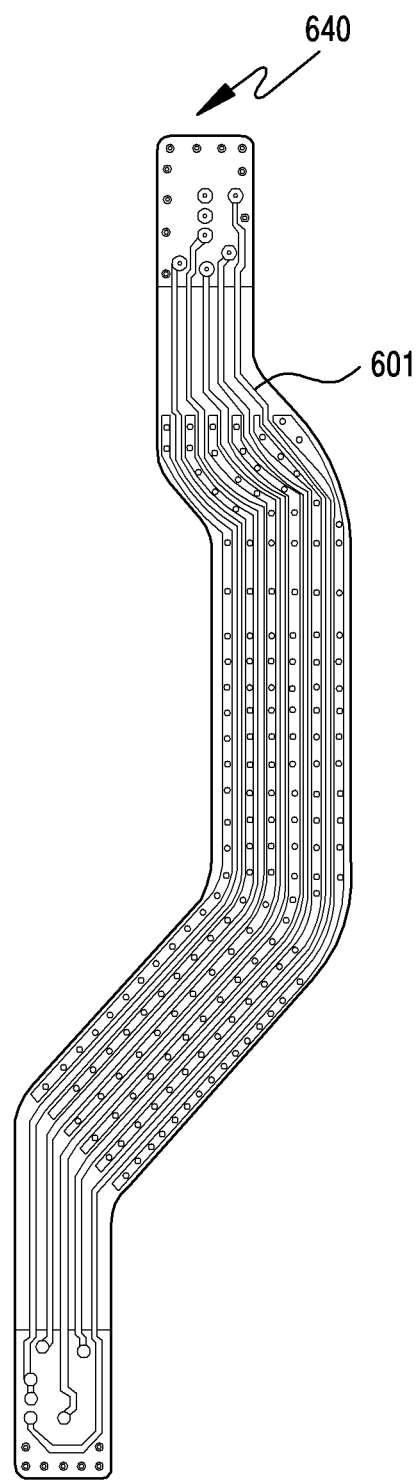
FIG. 6 is a diagram illustrating an example layer of an FRC according to various embodiments.

FIG. 6 is a diagram illustrating an example layer of an FRC 640 according to various embodiments.

Referring to FIG. 6, the FRC 640 (e.g., the FRC 240 of FIG. 4) may include a plurality of layers. The plurality of layers may include at least one conductive layer and at least one non-conductive layer, and the at least one conductive layer and the at least one non-conductive layer may be alternately stacked.

In an embodiment, a plurality of wirings may be constructed in such a manner that the conductive layer is patterned. The plurality of wirings may include a transmission line 601 of a signal which is output from the LFEM 320. The plurality of transmission lines 601 may be implemented, and the number of transmission lines 601 may vary depending on a frequency band of the first antenna 351 and second antenna 352. However, for convenience of explanation, in FIG. 6, any one of the plurality of wirings included in the FRC 640 is illustrated as the transmission line 601 of the signal which is output from the LFEM 320.

In an embodiment, the transmission line 601 may be shielded in such a manner that it is surrounded by a ground layer (or ground line) in order to secure an isolation from other transmission lines and to reduce a transmission loss and influence from ambient noise. In an embodiment, even when the plurality of transmission lines 601 are implemented, each of the transmission lines 601 may be shielded in such a manner that it is surrounded by the ground layer.

In an embodiment, the FRC 640 may include a portion constructed of a flexible material which is bendable. The flexible portion may be any one of portions coupled with each other in the FRC 640, or may be a plurality of portions separated from each other. In an embodiment, since a shielding environment of the transmission line 601 is different in the flexible portion of the FRC 640 and a rigid portion thereof, a thickness and/or width of the transmission line 601 may be different.

Figure 7:
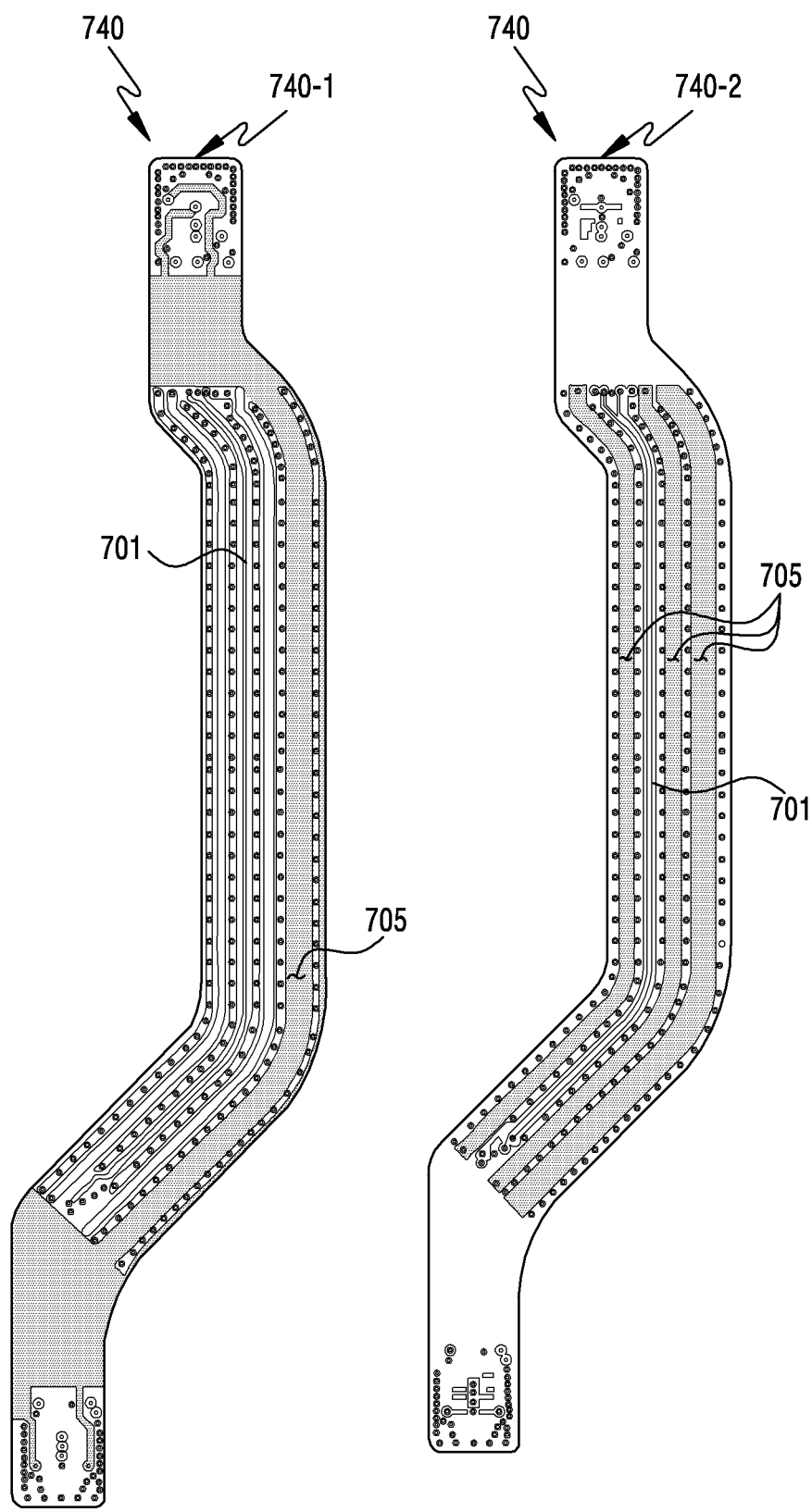
FIG. 7 is a diagram illustrating an example first layer and second layer of an FRC according to various embodiments.

FIG. 7 is a diagram illustrating an example first layer 740-1 and second layer 740-2 of an FRC 740 according to various embodiments.

Referring to FIG. 7, the FRC 740 (e.g., the FRC 240 of FIG. 4) may include a plurality of layers. The plurality of layers may include at least one conductive layer and at least one non-conductive layer, and the at least one conductive layer and the at least one non-conductive layer may be alternately stacked. The first layer 740-1 and second layer 740-2 of FIG. 7 do not refer to an order in which a plurality of layers included in the FRC 740 are stacked. The first layer 740-1 may refer to a first layer which is any one of the plurality of layers, and the second layer 740-2 may refer to a second layer which is another one of the plurality of layers. The FRC 740 may include a layer (not shown) among the plurality of layers.

In an embodiment, the FRC 740 (e.g., the FRC 240 of FIG. 4) may include a plurality of wirings. The plurality of wirings may include a plurality of transmission lines 701. In an embodiment, the plurality of transmission lines 701 may be a line for transmitting a wireless communication signal output from the LFEM 320 to the RF transceiver 310. The FRC 740 may include other wirings in addition to the plurality of transmission lines 701. The other wirings may include a power transmission line, a line for transmitting a signal input to the LFEM 320, or various other signals/data lines.

In an embodiment, since a wireless communication signal which passes through the plurality of transmission lines 701 has an increased gain and reduced noise due to the LFEM 320, the plurality of transmission lines 701 may be shielded by a common ground layer which surrounds all of the plurality of transmission lines 701.

In an embodiment, the FRC 740 may use the common ground layer to reduce an area required to shield the plurality of transmission lines 701.

A line width required for each of the plurality of transmission lines 701 may vary depending on a frequency of the wireless communication signal, and each of the plurality of transmission lines 701 may easily secure the required line width due to the reduced area of the FRC 740.

In an embodiment, a fill-cut area 705 from which a ground layer is removed may be constructed in at least part of the reduced area of the FRC 740, and impedance matching of other wirings included not only in the plurality of transmission lines 701 but also in the FRC 740 may be easily performed.

In an embodiment, other signal/data wirings can be additionally instructed in the reduced area of the FRC 740, thereby improving a utility of the FRC 740.

In an embodiment, a width of the FRC 740 can be reduced due to the reduced area of the FRC 740, thereby improving a degree of freedom for mounting other components mounted in the electronic device 101.

According to an example embodiment, an electronic device may include: a first Printed Circuit Board (PCB), a second PCB, a Radio Frequency (RF) transceiver disposed on the first PCB, a Flexible Printed Circuit Board (FPCB) coupled with the first PCB and the second PCB and electrically coupled with the RF transceiver, the FPCB including a transmission line of a wireless communication signal, an amplifier disposed on the second PCB and electrically coupled with the RF transceiver by the FPCB, a first antenna electrically coupled with the amplifier through the second PCB and configured to receive a wireless communication signal corresponding to a first frequency, and a second antenna electrically coupled with the amplifier through the second PCB and configured to receive a wireless communication signal corresponding to a second frequency. The first antenna and the second antenna may be disposed closer to the second PCB than the first PCB in the electronic device. The amplifier may amplify a wireless communication signal received from the first antenna and second antenna.

According to an example embodiment, the electronic device may further include a housing in which the first PCB and the second PCB are disposed, and a first conductive member comprising a conductive material disposed on a face opposite a face on which the amplifier is disposed in the second PCB. The first conductive member may be electrically coupled with the amplifier, the FPCB, and the housing.

According to an example embodiment, the electronic device may further include a protection element comprising an electronic device separate from the first conductive member and disposed to the second PCB. The protection element may be electrically coupled with a ground of the second PCB. The first conductive member may be electrically coupled to the protection element and the housing.

In an example embodiment, the FPCB may be coupled with a connector provided in the second PCB. The first conductive member may be closer to the connector than the amplifier.

According to an example embodiment, the electronic device may further include a second conductive member comprising a conductive material separate from the first conductive member and disposed on an opposite face of the second PCB. The second conductive member may be electrically coupled with the protection element and the housing, and may be closer to the amplifier than the connector.

In an example embodiment, the protection element may include a varistor, a zener diode, or a capacitor.

In an example embodiment, the second PCB may include a connector coupled with the FPCB. The first antenna may be electrically coupled at a first point of the second PCB. The amplifier may be disposed between the first point and the connector.

In an example embodiment, the second antenna may be electrically coupled at a second point of the second PCB. The amplifier may be disposed between the second point and the connector.

In an example embodiment, the amplifier may include at least one Low Noise Amplifier (LNA) and at least one band pass filter.

In an example embodiment, the transmission line of the FPCB may include a plurality of transmission lines through which a signal output from the amplifier is transmitted to the RF transceiver.

In an example embodiment, the FPCB may include a shielding layer individually surrounding each of the plurality of transmission lines.

In an example embodiment, the FPCB may include a shielding layer collectively shielding all of the plurality of transmission lines.

In an example embodiment, the first antenna and the second antenna may include a Laser Directing Structuring (LDS) antenna or an antenna constructed by dividing part of a metal housing of the electronic device into a non-conductive member.

In an example embodiment, the first antenna and the second antenna may be configured to operate as an antenna for Multiple Input Multiple Output (MIMO) communication.

In an example embodiment, the FPCB may be a first FPCB. The electronic device may include a second FPCB electrically coupling the first PCB and the second PCB.

According to an example embodiment, an electronic device may include: a housing, a first PCB disposed in the housing, a second PCB spaced apart from the first PCB and disposed in the housing, an RF transceiver circuit disposed on the first PCB, a Flexible printed circuit Radio frequency Cable (FRC) coupled with the first PCB and the second PCB, an amplifier disposed on a first face of the second PCB and electrically coupled with the RF transceiver circuit by the FRC, a first antenna disposed on the first face of the second PCB and electrically coupled with the amplifier, and a second antenna disposed on the first face of the second PCB and electrically coupled with the amplifier. The first antenna and the second antenna may be configured to operate as an antenna for MIMO communication. The RF transceiver circuit may be configured to amplify an RF signal received through the first antenna and the second antenna, using the amplifier, and receive the amplified signal output from the amplifier through the FRC.

According to an example embodiment, the electronic device may further include a first protection element comprising an electronic device disposed on a second face facing the first face of the second PCB, and a first conductive connection member comprising a conductive material disposed on the second face of the second PCB and in contact with a portion of a conductive material of the housing. The first protection element may be electrically coupled with the FRC and the amplifier. The first conductive connection member may be electrically coupled with the first protection element.

According to an example embodiment, the electronic device may further include a second protection element comprising an electronic device disposed on the second face of the second PCB, and a second conductive connection member disposed on the second face of the second PCB, separate from the first conductive connection member, and in contact with the portion of the conductive material of the housing. The second protection element may be electrically coupled with the FRC and the amplifier. The second conductive connection member may be electrically coupled with the second protection element.

In an example embodiment, the first conductive connection member may be closer to a connector by which the FRC is coupled to the second PCB than the amplifier. The second conductive connection member may be closer to the amplifier than the connector.

In an example embodiment, the FRC may be coupled to a connector in the second PCB. The amplifier may be disposed between the first antenna and the connector, and may be disposed between the second antenna and the connector.

Advantages acquired in the disclosure are not limited to the aforementioned advantages. Other advantages not mentioned herein can be clearly understood by those skilled in the art to which the disclosure pertains from the following descriptions.

Methods based on the embodiments disclosed in the claims and/or the disclosure can be implemented in hardware, software, or a combination of both.

When implemented in software, computer readable recording medium for storing one or more programs (e.g., software modules) can be provided. The one or more programs stored in the computer readable recording medium are configured for execution performed by one or more processors in the electronic device. The one or more programs include instructions for allowing the electronic device to execute the methods based on the embodiments disclosed in the claims and/or specification of the disclosure.

The program (e.g., the software module or software) can be stored in a random access memory, a non-volatile memory including a flash memory, a Read Only Memory (ROM), an Electrically Erasable Programmable Read Only Memory (EEPROM), a magnetic disc storage device, a Compact Disc-ROM (CD-ROM), Digital Versatile Discs (DVDs) or other forms of optical storage devices, and a magnetic cassette. Alternatively, the program can be stored in a memory configured in combination of all or some of these storage media. In addition, the configured memory can be plural in number.

Further, the program can be stored in an attachable storage device capable of accessing the electronic device through a communication network such as the Internet, an Intranet, a Local Area Network (LAN), a Wide LAN (WLAN), or a Storage Area Network (SAN) or a communication network configured by combining the networks. The storage device can have an access to a device for performing an embodiment of the disclosure via an external port. In addition, an additional storage device on a communication network can have an access to the device for performing the embodiment of the disclosure.

In the aforementioned example embodiments of the disclosure, a component included in the disclosure is expressed in a singular or plural form according to the specific embodiment proposed herein. However, the singular or plural expression is selected properly for a situation proposed for the convenience of explanation, and thus the various embodiments of the disclosure are not limited to a single or a plurality of components. Therefore, a component expressed in a plural form can also be expressed in a singular form, or vice versa.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims.

What is claimed is:

1. An electronic device comprising:
a first Printed Circuit Board (PCB);
a second PCB;
a Radio Frequency (RF) transceiver disposed on the first PCB;
a Flexible Printed Circuit Board (FPCB) coupled with the first PCB and the second PCB, electrically coupled with the RF transceiver, and including a transmission line of a wireless communication signal;
an amplifier disposed on the second PCB and electrically coupled with the RF transceiver by the FPCB;
a first antenna electrically coupled with the amplifier through the second PCB and configured to receive a wireless communication signal corresponding to a first frequency; and
a second antenna electrically coupled with the amplifier through the second PCB and configured to receive a wireless communication signal corresponding to a second frequency,
wherein the first antenna and the second antenna are disposed closer to the second PCB than the first PCB in the electronic device, and
wherein the amplifier is configured to amplify a wireless communication signal received from the first antenna and second antenna.

2. The electronic device of claim 1, further comprising:
a housing in which the first PCB and the second PCB are disposed; and
a first conductive member comprising a conductive material disposed on a face opposite a face on which the amplifier is disposed in the second PCB,
wherein the first conductive member is electrically coupled with the amplifier, the FPCB, and the housing.

3. The electronic device of claim 2, further comprising
a protection element comprising an electronic device separate from the first conductive member and disposed to the second PCB,
wherein the protection element is electrically coupled with a ground of the second PCB, and
wherein the first conductive member is electrically coupled to the protection element and the housing.

4. The electronic device of claim 3,
wherein the FPCB is coupled with a connector provided in the second PCB, and
wherein the first conductive member is closer to the connector than the amplifier.

5. The electronic device of claim 4, further comprising
a second conductive member comprising a conductive material separate from the first conductive member and disposed on the opposite face of the second PCB,
wherein the second conductive member is electrically coupled with the protection element and the housing, and is closer to the amplifier than the connector.

6. The electronic device of claim 3, wherein the protection element includes a varistor, a zener diode, or a capacitor.

7. The electronic device of claim 1,
wherein the second PCB includes a connector coupled with the FPCB,
wherein the first antenna is electrically coupled at a first point of the second PCB, and
wherein the amplifier is disposed between the first point and the connector.

8. The electronic device of claim 7,
wherein the second antenna is electrically coupled at a second point of the second PCB, and
wherein the amplifier is disposed between the second point and the connector.

9. The electronic device of claim 1, wherein the amplifier includes at least one Low Noise Amplifier (LNA) and at least one band pass filter.

10. The electronic device of claim 1, wherein the transmission line of the FPCB includes a plurality of transmission lines configured to transmit a signal output from the amplifier to the RF transceiver.

11. The electronic device of claim 10, wherein the FPCB includes a shielding layer individually surrounding each of the plurality of transmission lines.

12. The electronic device of claim 10, wherein the FPCB includes a shielding layer collectively shielding all of the plurality of transmission lines.

13. The electronic device of claim 1, wherein the first antenna and the second antenna include a Laser Directing Structuring (LDS) antenna or an antenna provided by dividing part of a metal housing of the electronic device into a non-conductive member.

14. The electronic device of claim 1, wherein the first antenna and the second antenna are configured to operate as an antenna for Multiple Input Multiple Output (MIMO) communication.

15. The electronic device of claim 1,
wherein the FPCB is a first FPCB, and
wherein the electronic device includes a second FPCB electrically coupling the first PCB and the second PCB.

16. An electronic device comprising:
a housing;
a first PCB disposed in the housing;
a second PCB spaced apart from the first PCB and disposed in the housing;
an RF transceiver circuit disposed on the first PCB;
a Flexible printed circuit Radio frequency Cable (FRC) coupling with the first PCB and the second PCB;
an amplifier disposed on a first face of the second PCB and electrically coupled with the RF transceiver circuit by the FRC;
a first antenna disposed on the first face of the second PCB and electrically coupled with the amplifier; and
a second antenna disposed on the first face of the second PCB and electrically coupled with the amplifier,
wherein the first antenna and the second antenna are configured to operate as an antenna for MIMO communication, and
wherein the RF transceiver circuit is configured to:
amplify an RF signal received through the first antenna and the second antenna, using the amplifier; and
receive the amplified signal output from the amplifier through the FRC.

17. The electronic device of claim 16, further comprising:
a first protection element comprising an electronic device disposed on a second face facing the first face of the second PCB; and
a first conductive connection member comprising a conductive material disposed on the second face of the second PCB and in contact with a portion of a conductive material of the housing,
wherein the first protection element is electrically coupled with the FRC and the amplifier, and
wherein the first conductive connection member is electrically coupled with the first protection element.

18. The electronic device of claim 17, further comprising:
a second protection element comprising a second electronic device disposed on the second face of the second PCB; and
a second conductive connection member comprising a conductive material disposed on the second face of the second PCB, separate from the first conductive connection member, and in contact with the portion of the conductive material of the housing,
wherein the second protection element is electrically coupled with the FRC and the amplifier, and
wherein the second conductive connection member is electrically coupled with the second protection element.

19. The electronic device of claim 18,
wherein the first conductive connection member is closer to a connector by which the FRC is coupled to the second PCB than the amplifier, and
wherein the second conductive connection member is closer to the amplifier than the connector.

20. The electronic device of claim 16,
wherein the FRC is coupled to a connector in the second PCB, and
wherein the amplifier is disposed between the first antenna and the connector, and is disposed between the second antenna and the connector.

* * * * *